(12) United States Patent
Chong et al.

(10) Patent No.: US 7,083,425 B2
(45) Date of Patent: Aug. 1, 2006

(54) SLANTED VIAS FOR ELECTRICAL CIRCUITS ON CIRCUIT BOARDS AND OTHER SUBSTRATES

(75) Inventors: Chin Hui Chong, Singapore (SG); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/927,760

(22) Filed: Aug. 27, 2004

(65) Prior Publication Data

US 2006/0046537 A1    Mar. 2, 2006

(30) Foreign Application Priority Data

Aug. 27, 2004 (SG) ............................. 200405514-1

(51) Int. Cl.
*H01R 12/00* (2006.01)
*H05K 1/00* (2006.01)

(52) U.S. Cl. ............................ 439/66; 439/91; 438/667

(58) Field of Classification Search ................. 439/66, 439/591, 91; 438/667; 257/734
See application file for complete search history.

(56) References Cited

U.S. PATENT DOCUMENTS 4,534,100 A * 8/1985 Lane .......................... 438/468
5,771,158 A   6/1998 Yamagishi et al.
6,774,486 B1 * 8/2004 Kinsman .................... 257/734
6,797,616 B1 * 9/2004 Kinsman .................... 438/667

FOREIGN PATENT DOCUMENTS

JP       2001077496 A      3/2001

OTHER PUBLICATIONS

Search Report and Examination Report for Singapore Application No. 200405514-1, 7 pages, Jul. 22, 2005.

* cited by examiner

Primary Examiner—Hae Moon Hyeon
(74) Attorney, Agent, or Firm—Perkins Coie LLP

(57) ABSTRACT

Circuit boards, microelectronic devices, and other apparatuses having slanted vias are disclosed herein. In one embodiment, an apparatus for interconnecting electronic components includes a dielectric portion having a first surface and a second surface. A first terminal is disposed on the first surface of the dielectric portion for connection to a first electronic component. A second terminal is disposed on the second surface of the dielectric portion for connection to a second electronic component. The apparatus further includes a passage extending through the dielectric portion along a longitudinal axis oriented at an oblique angle relative to the first surface. The passage is at least partially filled with conductive material electrically connecting the first terminal to the second terminal.

39 Claims, 3 Drawing Sheets

SLANTED VIAS FOR ELECTRICAL CIRCUITS ON CIRCUIT BOARDS AND OTHER SUBSTRATES

TECHNICAL FIELD

The following disclosure relates generally to electrical circuits on circuit boards, microelectronic devices, and other substrates and, more particularly, to conductive vias used with such circuits.

BACKGROUND

Figure 1:
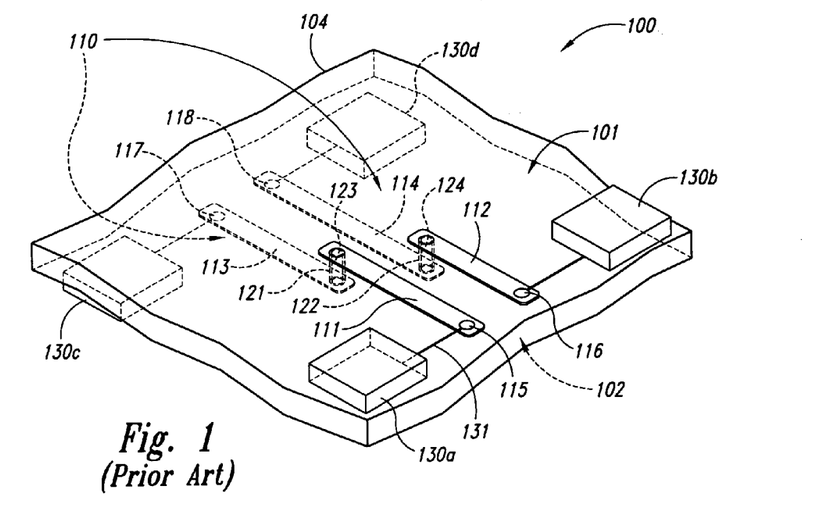
FIG. 1 is a partially schematic isometric view of a portion of a printed circuit board configured in accordance with the prior art.

Printed circuit boards (PCBs), printed wire boards (PWBs), and similar structures typically include a plurality of conductive lines or traces superimposed or "printed" on one or more sides of a non-conductive substrate. Electronic components can be mounted to the substrate and interconnected by means of wire bonds and/or solder attachments to the conductive lines. FIG. 1, for example, is an isometric view illustrating a portion of a PCB 100 configured in accordance with the prior art. The PCB 100 supports a plurality of electronic components 130 (illustrated schematically in FIG. 1 and identified individually as electronic components 130a–d). The electronic components 130 can include processing devices, routing devices, memory devices and other types of electronic devices typically found on conventional circuit boards in computers, cell phones, personal data assistants, and other electronic products.

The electronic components 130 are mounted to a non-conductive substrate 104 and are interconnected by means of an electrical circuit 110. The electrical circuit 110 includes a first conductive line 111 and a second conductive line 112 disposed on a first surface 101 of the non-conductive substrate 104. The electrical circuit 110 further includes a third conductive line 113 and a fourth conductive line 114 disposed on a second surface 102 of the non-conductive substrate 104 opposite to the first surface 101. The first conductive line 111 is electrically connected to the third conductive line 113 by conductive material 123 in a first passage 121 that extends vertically through the non-conductive substrate 104 from the first conductive line 111 to the third conductive line 113. The second conductive line 112 is similarly connected to the fourth conductive line 114 by conductive material 124 in a second passage 122 that extends vertically through the non-conductive substrate 104 from the second conductive line 112 to the fourth conductive line 114. The passages 121 and 122 are often referred to by those in the art as "plated through-holes" or "vias."

Each of the conductive lines 111–114 includes a corresponding contact or terminal (identified individually as a first terminal 115, a second terminal 116, a third terminal 117, and a fourth terminal 118, respectively). The first electronic component 130a is electrically connected to the first terminal 115 by a wire bond or solder attachment 131 (shown schematically). The second electronic component 130b, the third electronic component 130c, and the fourth electronic component 130d are electrically connected to the second terminal 116, the third terminal 117, and the fourth terminal 118, respectively, in a similar manner.

In the prior art example of FIG. 1, the conductive path between the first terminal 115 and the third terminal 117, and the conductive path between the second terminal 116 and the fourth terminal 118, are relatively straight and direct. In practice, however, it is not uncommon for the paths between two or more pairs of corresponding terminals to cross each other.

Figure 2:
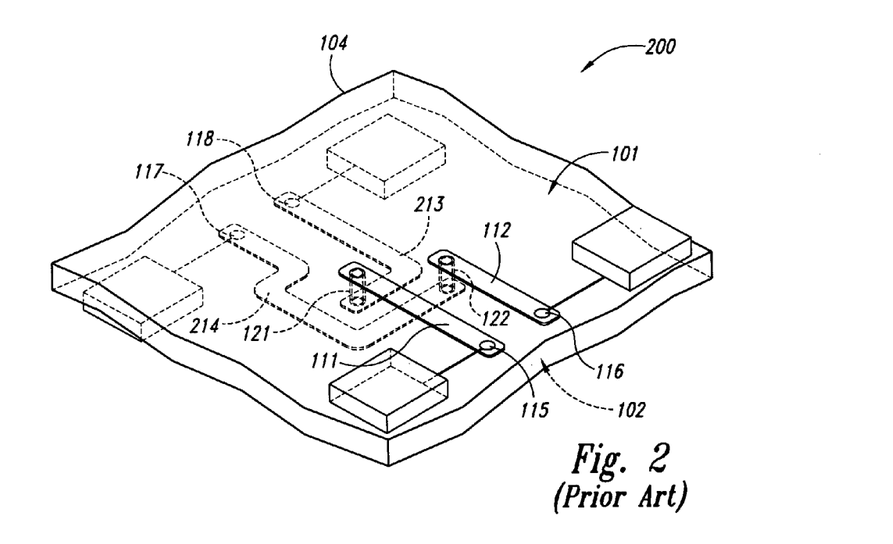
FIG. 2 is a partially schematic isometric view of another printed circuit board configured in accordance with the prior art.

FIG. 2 is an isometric view illustrating a portion of a prior art PCB 200 in which the paths between two pairs of corresponding terminals cross each other. Many of the features of the PCB 200 are at least generally similar in structure and function to corresponding features of the PCB 100 described above. For example, the PCB 200 includes the first conductive line 111 and the second conductive line 112 disposed on the first surface 101 of the non-conductive substrate 104. The PCB 200 also includes the first passage 121 and the second passage 122 extending vertically through the non-conductive substrate 104. In contrast to the PCB 100 described above, however, in the example of FIG. 2 the first terminal 115 is electrically connected to the fourth terminal 118, and the second terminal 116 is electrically connected to the third terminal 117.

To accommodate the change in terminals, the PCB 200 includes a third conductive line 213 extending from the first passage 121 to the fourth terminal 118, and a fourth conductive line 214 extending from the second passage 122 to the third terminal 117. As illustrated in FIG. 2, the third and fourth conductive lines 213 and 214 describe somewhat indirect paths between the passages 121 and 122 and the respective terminals. Specifically, the third conductive line 213 jogs away from the third terminal 117 to provide clearance for the fourth conductive line 214, and the fourth conductive line 214 routes around the first passage 121 before proceeding toward the third terminal 117.

There are a number of shortcomings associated with indirect conductive lines such as those described above with reference to FIG. 2. One shortcoming is that the increased line length increases the resistance and inductance in the circuit, thereby increasing the susceptibility to undesirable noise-related effects such as cross-talk. Another shortcoming is that the increased line length can reduce signal strength and increase signal delay. A further shortcoming is the additional material and complexity associated with manufacturing jogged, rather than straight, conductive lines.

BRIEF DESCRIPTION OF THE DRAWINGS

FIG. 4A is a partially hidden top view.

DETAILED DESCRIPTION

A. Overview

The following disclosure describes several embodiments of printed circuit boards, printed wiring boards, and other substrates and apparatuses for interconnecting electronic components. One aspect of the invention is directed toward an apparatus for interconnecting electronic components that includes a dielectric portion having a first surface opposite to a second surface. A first terminal is disposed on the first surface of the dielectric portion for connection to a first electronic component. A second terminal is disposed on the second surface of the dielectric portion for connection to a second electronic component. The apparatus further includes a passage extending through the dielectric portion along a longitudinal axis oriented at an oblique angle relative to the first surface. The passage is at least partially filled with conductive material to electrically connect the first terminal to the second terminal.

Another aspect of the invention is directed toward a method for manufacturing an apparatus for interconnecting electronic components. In one embodiment, the method includes forming a first conductive line on a first surface of a dielectric substrate, and forming a second conductive line on a second surface of the dielectric substrate facing opposite to the first surface. The method further includes extending a passage through the dielectric substrate from the first conductive line to the second conductive line, and at least partially filling the passage with conductive material to electrically connect the first conductive line to the second conductive line. In one aspect of this embodiment, the passage extends through the dielectric substrate along a longitudinal axis oriented at an oblique angle relative to the first surface of the dielectric substrate.

Many specific details of the present invention are described below with reference to circuit boards, such as printed circuit boards and printed wiring boards. The present invention, however, is not limited to such structures. Indeed, the terms "dielectric portion," "dielectric substrate," and "non-conductive substrate" as used throughout this disclosure do not refer solely to circuit board structures. To the contrary, these terms refer broadly to other structures upon which and/or in which electrical circuits are formed including, for example, microelectronic devices and packaged microelectronic devices (such as packaged microelectronic devices in stacked-chip and/or flip-chip arrangements). Accordingly, the terms listed above refer not only to circuit board substrates such as composite laminates, but also refer to microelectronic workpieces such as semiconductor wafers (e.g., silicon or gallium arsenide wafers), glass substrates, ceramic substrates, and other types of insulated substrates known to those of ordinary skill in the art.

Specific details of several embodiments of the invention are described below with reference to circuit boards and other apparatuses in order to provide a thorough understanding of such embodiments. Other details describing well-known structures often associated with such apparatuses are not set forth below to avoid unnecessarily obscuring the description of the various embodiments. Those of ordinary skill in the relevant art will understand, however, that the invention may have other embodiments that include other elements in addition to those described below. Alternatively, the invention may have still further embodiments that lack one or more of the elements described below.

In the Figures, identical reference numbers identify identical or at least generally similar elements. To facilitate the discussion of any particular element, the most significant digit or digits of any reference number refer to the Figure in which that element is first introduced. For example, element 310 is first introduced and discussed with reference to FIG. 3.

B. Embodiments of Electrical Circuits Having Slanted Vias

Figure 3:
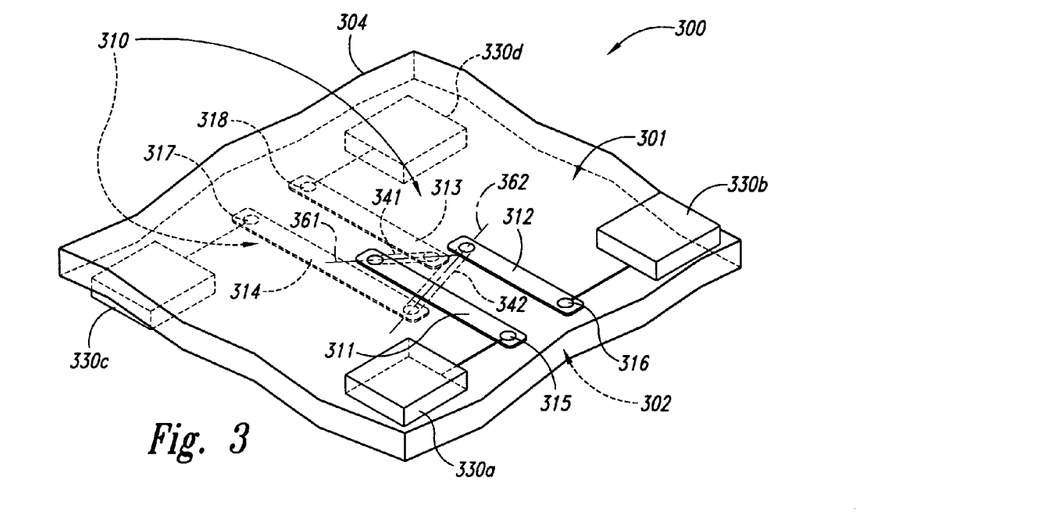
FIG. 3 is a partially schematic isometric view of a portion of an apparatus having slanted vias configured in accordance with an embodiment of the invention.

FIG. 3 is a partially schematic isometric view of a portion of an apparatus 300 having an electrical circuit 310 with slanted vias configured in accordance with an embodiment of the invention. In one embodiment, the apparatus 300 can represent a circuit board, such as a printed circuit board (PCB) or a printed wiring board (PWB). In other embodiments, the apparatus 300 can represent other structures having electrical circuits for interconnecting various types of electronic components. Such structures can include, for example, microelectronic workpieces and packaged microelectronic devices having electrical circuits composed of electrical traces, wire bonds, bond pads, vias, etc., for connecting integrated circuits. In further embodiments, the apparatus 300 can represent yet other structures having electrical circuits.

In the illustrated embodiment, the electrical circuit 310 includes a first conductive line 311 and a second conductive line 312 disposed one first surface 301 of a non-conductive substrate or dielectric portion 304. The electrical circuit 310 further includes a third conductive line 313 and a fourth conductive line 314 disposed on a second surface 302 of the dielectric portion 304 facing opposite to the first surface 301. A first contact or terminal 315 electrically connects a first electronic component 330a to the first conductive line 311, and a second terminal 316 electrically connects a second electronic component 330b to the second conductive line 312. Similarly, a third terminal 317 electrically connects a third electronic component 330c to the fourth conductive line 314, and a fourth terminal 318 electrically connects a fourth electronic component 330d to the third conductive line 313.

In one aspect of this embodiment, a first slanted via 341 (hereinafter the first "passage" 341) extends through the dielectric portion 304 along a first longitudinal axis 361, and a second slanted via 342 (hereinafter the second "passage" 342) extends through the dielectric portion 304 along a second longitudinal axis 362. The first longitudinal axis 361 intersects the first conductive line 311 and the third conductive line 313, and forms an oblique angle relative to the first surface 301 of the dielectric portion 304. The second longitudinal axis 362 intersects the second conductive line 312 and the fourth conductive line 314, and also forms an oblique angle relative to the first surface 301 of the dielectric portion 304. The first passage 341 is at least partially filled with conductive material 343 to electrically connect the first conductive line 311 to the third conductive line 313. Similarly, the second passage 342 is at least partially filled with conductive material 344 to electrically connect the second conductive line 312 to the fourth conductive line 314.

The apparatus 300 can be manufactured in a number of different ways and with a number of different materials depending on the particular application or the intended use. In a circuit board embodiment, for example, the dielectric portion 304 can include a glass-reinforced polymer laminate (e.g., FR-4) having a copper foil laminated to both the first surface 301 and the second surface 302. The copper foil forms the basis of the conductive lines 311–314. The passages 341 and 342 can be formed through the laminate by mechanical drilling, laser drilling (e.g., "mask image" drilling or "conformal image" drilling), or other suitable methods known in the art.

The passages 341 and 342 are filled with copper to electrically couple (a) the first conductive line 311 to the third conductive line 313, and (b) the second conductive line 312 to the fourth conductive line 314. For example, after the passages 341 and 342 have been formed and cleaned, copper can be electrolessly deposited over the copper foil and onto the inner walls of the passages 341 and 342 to form a seed layer for bulk copper deposition into the passages 341 and 342. The seed layer and copper foil on the first surface 301 and the second surface 302 are then covered with a mask using a suitable image transfer process. The passages 341 and 342 are then filled with a suitable conductive material by electroplating the conductive material on the walls of the passages 341 and 342. The conductive material also plates onto the exposed areas of copper on the first and second surfaces 301 and 302 to form the conductive lines 311–314. The conductive material can include a number of different metals such as copper, tin, lead, etc., known in the art. After electroplating, the mask layer is stripped and the unwanted metallic material on the first and second surfaces 301 and 302 around the conductive lines 311–314 is removed by a suitable process, such as chemical etching. At this point in the manufacturing process, the electronic components 330a–d can be electrically connected to the corresponding terminals 315–318, respectively, using wire bonds, solder connections, or other suitable methods known in the art.

Although the method of manufacturing described above may be suitable for some embodiments of the present invention, other manufacturing processes can be used for other embodiments without departing from the spirit or scope of the present disclosure. For example, in other embodiments of the invention, the apparatus 300 can be a portion of an electronic device, such as a microelectronic device. In a microelectronic device, the dielectric portion 304 can be a portion of a silicon wafer that contains one or more integrated circuits (i.e., a "die" or "chip"). In such embodiments, the slanted vias of the present invention can be used as electrical conduits for connecting two or more dies in, for example, a stacked-chip or flip-chip arrangement. Accordingly, the slanted vias of the present invention are not limited to circuit board applications, but extend to other apparatuses for interconnecting electronic components at both the circuit board and microelectronic device level.

Figure 4A:
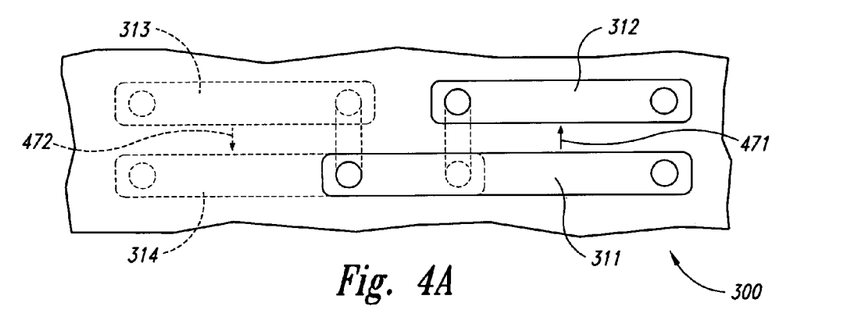
Figure 4B:
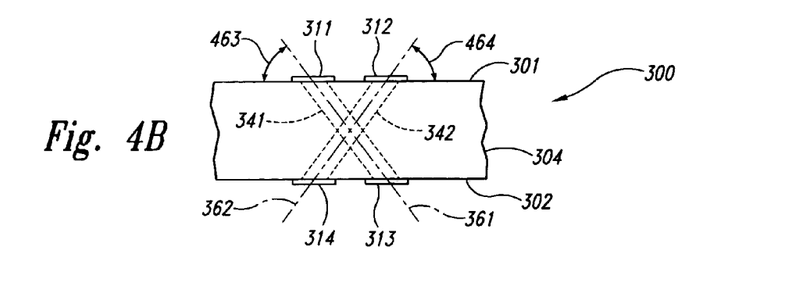
FIG. 4B is a partially hidden end view, of the apparatus of FIG. 3.

FIG. 4A is a partially hidden top view of the apparatus 300 of FIG. 3, and FIG. 4B is a partially hidden end view of the apparatus 300 of FIG. 3, for the purpose of further illustrating the spatial relationships between the various features of the electrical circuit 310. As FIG. 4A illustrates, the second conductive line 312 is offset from the first conductive line 311 in a first direction 471 on the first surface 301 of the dielectric portion 304. The fourth conductive line 314 is offset from the third conductive line 313 on the second surface 302 in a second direction 472 that is opposite to the first direction 471. Further, in the illustrated embodiment the fourth conductive line 314 is at least approximately aligned with the first conductive line 311, and the third conductive line 313 is at least approximately aligned with the second conductive line 312. As FIG. 4B illustrates, the first longitudinal axis 361 of the first passage 341 passes through the first conductive line 311 and the third conductive line 313, and forms a first oblique angle 463 relative to the first surface 301 of the dielectric portion 304. Similarly, the second longitudinal axis 362 of the second passage 342 passes through the second conductive line 312 and the fourth conductive line 314, and forms a second oblique angle 464 relative to the first surface 301 of the dielectric portion 304.

FIGS. 3–4B together illustrate that slanting the passages 341 and 342 enables the third conductive line 313 and the fourth conductive line 314 to be at least generally straight and direct without any jogs. One advantage of this feature over the jogged conductive lines 213 and 214 described above with reference to prior art FIG. 2 is that the direct paths of the present invention can increase processing speed and reduce the electrical resistance and inductance in the circuit, thereby decreasing the susceptibility to undesirable noise-related effects during signal transmission. A further advantage of this feature is that direct paths require less material and are easier to manufacture than jogged paths. In addition, slanted vias offer a useful design alternative when dealing with complicated circuit boards having a large number of conductive lines compressed into a small area.

The spatial arrangements of the features illustrated in FIGS. 3–4B are merely representative of one particular embodiment of the invention. Accordingly, the present invention is not limited to the particular arrangements illustrated in these Figures. To the contrary, the slanted vias of the present invention can be used in a multitude of other electrical circuit arrangements having more or fewer conductive lines, terminals, and/or via elements than those shown in FIGS. 3–4B.

Figure 5:
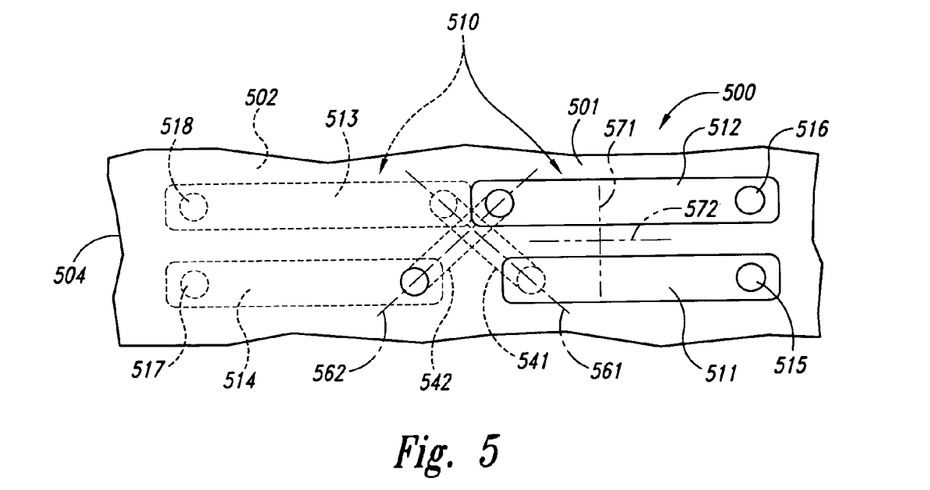
FIG. 5 is a partially hidden top view of an apparatus having slanted vias configured in accordance with another embodiment of the invention.

FIG. 5 is a partially hidden top view of an apparatus 500 having an electrical circuit 510 with slanted vias configured in accordance with another embodiment of the invention. Many features of the apparatus 500 are at least generally similar in structure and function to the corresponding features of the apparatus 300 described in detail above with reference to FIGS. 3–4B. For example, the apparatus 500 includes a dielectric portion 504 having a first surface 501 and an opposing second surface 502. A first conductive line 511 is disposed on the first surface 501 adjacent to a second conductive line 512. Similarly, a third conductive line 513 is disposed on the second surface 502 adjacent to a fourth conductive line 514. Each of the conductive lines 511–514 includes a corresponding terminal 515–518, respectively. In the illustrated embodiment, the first conductive line 511 is electrically connected to the third conductive line 513 by a first passage 541 extending through the dielectric portion 504 along a first longitudinal axis 561. Similarly, the second conductive line 512 is electrically connected to the fourth conductive line 514 by a second passage 542 extending through the dielectric portion 504 along a second longitudinal axis 562.

The apparatus 500 of FIG. 5 may offer certain advantages over the apparatus 300 of FIGS. 3–4B because the overall lengths of the conductive paths between the terminals 515 and 518, and between the terminals 516 and 517, are shorter on the apparatus 500. As illustrated in FIG. 5, the paths are shorter because the passages 541 and 542 are not only slanted along a first axis 571 toward the respective conductive lines, but are also slanted along a second axis 572 toward the respective terminals. By slanting the passages 541 and 542 in this manner, the conductive paths can be further shortened over the embodiment illustrated in FIGS. 3–4B. Accordingly, those of ordinary skill in the art will appreciate that the various different slant angles can be incorporated into a particular circuit design without departing from the spirit or scope of the present disclosure. The choice of slant angle will depend on the particular application and the particular design constraints.

Figure 6A:
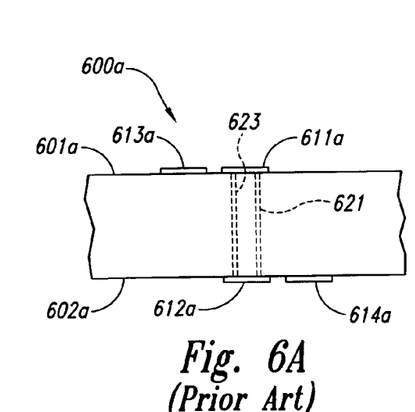
FIG. 6A is a partially hidden end view of a circuit board having a vertical via configured in accordance with the prior art.
Figure 6B:
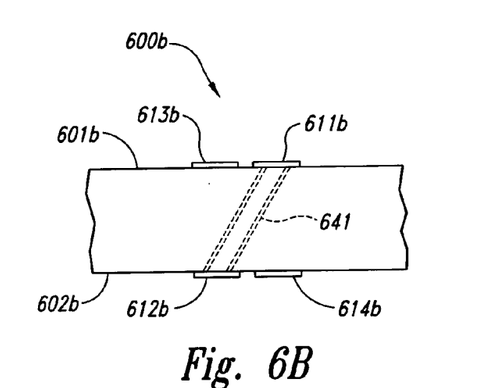
FIG. 6B is a partially hidden end view of a circuit board having a slanted via configured in accordance with an embodiment of the invention.

FIG. 6A is a partially hidden end view of an apparatus 600a configured in accordance with the prior art, and FIG. 6B is a partially hidden end view of an apparatus 600b configured in accordance with an embodiment of the present invention. Together, FIGS. 6A–B illustrate the flexibility offered by slanted vias from a design perspective. Referring first to FIG. 6A, the prior art apparatus 600a includes a first conductive line 611a electrically connected to a second conductive line 612a by a vertical passage 621 at least partially filled with a conductive material 623. The apparatus 600a further includes a third conductive line 613a positioned adjacent to the first conductive line 611a, and a fourth conductive line 614a positioned adjacent to the second conductive line 612a. As FIG. 6A illustrates, the vertical passage 621 precludes positioning the fourth conductive line 614a directly beneath the first conductive line 611a, and positioning the third conductive line 613a directly above the second conductive line 612a, should either of those positions be desired.

Referring next to FIG. 6B, the apparatus 600b configured in accordance with the present invention includes a first conductive line 611b electrically connected to a second conductive line 612b by a slanted passage 641 at least partially filled with conductive material 643. As FIG. 6B illustrates, slanting the passage 641 enables a fourth conductive line 614b to be positioned directly beneath the first conductive line 611b, and a third conductive line 613b to be positioned directly above the second conductive line 612b, should either of those positions be desired. Further, slanting the passage 641 enables a more efficient arrangement of the four conductive lines 611b–614b because together they consume a narrower section of the apparatus 600b than the four conductive lines 611a–614a consume of the apparatus 600a.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:
1. An apparatus for interconnecting electronic components, the apparatus comprising:
a dielectric portion having a first surface and a second surface, the first surface facing opposite to the second surface;
a first terminal on the first surface of the dielectric portion for connection to a first electronic component;
a second terminal on the second surface of the dielectric portion for connection to a second electronic component;
a first passage formed through the dielectric portion along a first longitudinal axis oriented at first oblique angle relative to the first surface, wherein the first passage is at least partially filled with a first portion of conductive material after forming, and wherein the first portion of conductive material electrically connects the first terminal to the second terminal;
a third terminal disposed on the first surface of the dielectric portion;
a fourth terminal disposed on the second surface of the dielectric portion; and
a second passage formed through the dielectric portion along a second longitudinal axis that is non-parallel to the first longitudinal axis and oriented at a second oblique angle relative to the first surface, wherein the second passage is at least partially filled with a second portion of conductive material after forming, and wherein the second portion of conductive material electrically connects the third terminal to the fourth terminal.

2. The apparatus of claim 1, further comprising:
a first conductive line disposed on the first surface of the dielectric portion and connecting the first terminal to the first portion of conductive material in the first passage; and
a second conductive line disposed on the second surface of the dielectric portion and connecting the second terminal to the first portion of conductive material in the first passage.

3. The apparatus of claim 1 further comprising:
a first conductive line disposed on the first surface of the dielectric portion and connecting the first terminal to the first portion of conductive material in the first passage;
a second conductive line disposed on the second surface of the dielectric portion and connecting the second terminal to the first portion of conductive material in the first passage;
a third conductive line disposed on the first surface of the dielectric portion and connecting the third terminal to the second portion of conductive material in the second passage, wherein the third conductive line is offset from the first conductive line in a first direction; and
a fourth conductive line disposed on the second surface of the dielectric portion and connecting the fourth terminal to the second portion of conductive material in the second passage, wherein the fourth conductive line is offset from the second conductive line in a second direction opposite to the first direction.

4. The apparatus of claim 1 wherein the dielectric portion includes a section of a printed circuit board substrate.

5. The apparatus of claim 1 wherein the dielectric portion includes a section of glass-reinforced polymer.

6. The apparatus of claim 1 wherein the dielectric portion includes a section of ceramic material.

7. The apparatus of claim 1 wherein the dielectric portion is part of a microelectronic device.

8. The apparatus of claim 1 wherein the dielectric portion includes part of a silicon wafer.

9. The apparatus of claim 1 wherein the first passage is at least partially hollow.

10. The apparatus of claim 1 wherein the first terminal is formed at a first end of the first passage and the second terminal is formed at a second end of the first passage.

11. A circuit board comprising:
a non-conductive substrate having a first surface and a second surface, the second surface facing opposite to the first surface; and
an electrical circuit including:
a first conductive line carried by the first surface of the non-conductive substrate;
a second conductive line carried by the second surface of the non-conductive substrate;
a first passage formed through the non-conductive substrate along a first longitudinal axis, wherein the first passage is at least partially filled with a first portion of conductive material after forming, wherein the first portion of conductive material electrically connects the first conductive line to the second conductive line, and wherein the first longitudinal axis of the first passage is oriented at a first oblique angle relative to the first surface of the non-conductive substrate;
a third conductive line carried by the first surface of the non-conductive substrate;
a fourth conductive line carried by the second surface of the non-conductive substrate; and
a second passage extending through the non-conductive substrate along a second longitudinal axis, wherein the second passage is at least partially filled with a second portion of conductive material after forming, wherein the second portion of conductive material electrically connects the third conductive line to the fourth conductive line, and wherein the second longitudinal axis is non-parallel to the first longitudinal axis and is oriented at a second oblique angle relative to the first surface of the non-conductive substrate.

12. The circuit board of claim 11 wherein the second longitudinal axis is oriented at a third oblique angle relative to the first longitudinal axis of the first passage.

13. The circuit board of claim 11 wherein at least a portion of the third conductive line is offset from the first conductive line in a first direction, and wherein at least a portion of the fourth conductive line is offset from the second conductive line in a second direction opposite to the first direction.

14. The circuit board of claim 11 wherein at least a portion of the third conductive line is parallel to the first conductive line and offset from the first conductive line in a first direction, and wherein at least a portion of the fourth conductive line is parallel to the second conductive line and offset from the second conductive line in a second direction opposite to the first direction.

15. A circuit board comprising:
a composite laminate having a first surface and a second surface, the second surface facing opposite to the first surface; and
an electrical circuit including:
a first conductive line having a first end portion disposed on the first surface of the composite laminate;
a second conductive line having a second end portion disposed on the first surface of the composite laminate, wherein the second conductive line is at least partially offset from the first conductive line in a first direction;
a third conductive line having a third end portion disposed on the second surface of the composite laminate;
a fourth conductive line having a fourth end portion disposed on the second surface of the composite laminate, wherein the fourth conductive line is at least partially offset from the third conductive line in a second direction opposite to the first direction;
a first passage formed through the composite laminate, the first end portion of the first conductive line, and the third end portion of the third conductive line, wherein the first passage is at least partially filled with a first portion of conductive material after forming, and wherein the first portion of conductive material electrically connects the first conductive line to the third conductive line; and
a second passage formed through the composite laminate, the second end portion of the second conductive line, and the third end portion of the third conductive line, wherein the second passage is at least partially filled with a second portion of conductive material after forming, wherein the second portion of conductive material electrically connects the second conductive line to the fourth conductive line, and wherein the second passage is slanted relative to the first passage.

16. The circuit board of claim 15 wherein the first passage extends along a longitudinal axis oriented at an oblique angle relative to the first surface of the composite laminate.

17. The circuit board of claim 15 wherein the first passage is slanted in a first direction relative to the first surface of the composite laminate and the second passage is slanted in a second direction different than the first direction.

18. The circuit board of claim 15, further comprising:
a first electronic component supported on the first surface of the composite laminate and electrically connected to the first conductive line; and
a second electronic component supported on the second surface of the composite laminate and electrically connected to the second conductive line.

19. The circuit board of claim 15 wherein the first and second conductive lines are disposed on the first surface of the composite laminate, and wherein at least a portion of the second conductive line is parallel to a portion of the first conductive line.

20. The circuit board of claim 15 wherein the first conductive line is disposed on the first surface of the composite laminate, wherein the third conductive line is disposed on the second surface of the composite laminate, and wherein at least a portion of the third conductive line is parallel to a portion of the first conductive line.

21. The circuit board of claim 15 wherein the first conductive line is disposed on the first surface of the composite laminate, wherein the third conductive line is disposed on the second surface of the composite laminate, and wherein at least a portion of the third conductive line is parallel to and in vertical alignment with a portion of the first conductive line.

22. The circuit board of claim 15 wherein the first and second conductive lines are disposed on the first surface of the composite laminate, wherein the third and fourth conductive lines are disposed on the second surface of the composite laminate, wherein at least a portion of the third conductive line is parallel to and in vertical alignment with a portion of the first conductive line, and wherein at least a portion of the fourth conductive line is parallel to and in vertical alignment with a portion of the second conductive line.

23. The circuit board of claim 15 wherein the composite laminate includes fiber reinforced epoxy.

24. The circuit board of claim 15 wherein the first, second, third, and fourth conductive lines include copper traces deposited on the composite laminate.

25. A method for manufacturing an apparatus for interconnecting electronic components, the method comprising:
forming a first conductive line on a first surface of a dielectric substrate;
forming a second conductive line on a second surface of the dielectric substrate, the second surface of the dielectric substrate facing opposite to the first surface of the dielectric substrate;
forming a first passage through the dielectric substrate from the first conductive line to the second conductive line along a first longitudinal axis oriented at a first oblique angle relative to the first surface of the dielectric substrate;
after forming the first passage, at least partially filling the first passage with a first portion of conductive material to electrically connect the first conductive line to the second conductive line;
forming a third conductive line on the first surface of the dielectric substrate;
forming a fourth conductive line on the second surface of the dielectric substrate;
forming a second passage through the dielectric substrate from the third conductive line to the fourth conductive line along a second longitudinal axis oriented at a second oblique angle relative to the first surface of the dielectric substrate, wherein the second longitudinal axis is non-parallel to the first longitudinal axis; and
after forming the second passage, at least partially filling the second passage with a second portion of conductive material to electrically connect the third conductive line to the fourth conductive line.

26. The method of claim 25 wherein the third conductive line is at least partially offset from the first conductive line in a first direction, and wherein the fourth conductive line is at least partially offset from the second conductive line in a second direction opposite to the first direction.

27. The method of claim 25 wherein forming the first passage through the dielectric substrate includes drilling the first passage.

28. The method of claim 25 wherein forming the first passage through the dielectric substrate includes forming the first passage with a laser.

29. A method for manufacturing a circuit board, the method comprising:
forming a fiber-reinforced, non-conductive substrate;
forming a first conductive line on a first surface of the non-conductive substrate;
forming a second conductive line on a second surface of the non-conductive substrate, the second surface of the non-conductive substrate facing opposite to the first surface of the non-conductive substrate;
forming a first passage through the non-conductive substrate from the first conductive line to the second conductive line along a first longitudinal axis oriented at a first oblique angle relative to the first surface of the non-conductive substrate;
after forming the first passage, at least partially filling the first passage with a first portion of conductive material to electrically connect the first conductive line to the second conductive line;
forming a third conductive line on the first surface of the non-conductive substrate;
forming a fourth conductive line on the second surface of the non-conductive substrate;
forming a second passage through the non-conductive substrate from the third conductive line to the fourth conductive line along a second longitudinal axis oriented at a second oblique angle relative to the first surface of the non-conductive substrate, wherein the second longitudinal axis is slanted relative to the first longitudinal axis;
after forming the second passage, at least partially filling the second passage with a second portion of conductive material to electrically connect the third conductive line to the fourth conductive line.

30. The method of claim 29, further comprising:
laminating a first conductive layer on the first surface of the non-conductive substrate; and
laminating a second conductive layer on the second surface of the non-conductive substrate, wherein forming the first conductive line on the first surface of the non-conductive substrate includes removing a portion of the first conductive layer, and wherein forming the second conductive line on the second surface of the non-conductive substrate includes removing a portion of the second conductive layer.

31. The method of claim 29, further comprising:
laminating a first metal layer on the first surface of the non-conductive substrate; and
laminating a second metal layer on the second surface of the non-conductive substrate, wherein forming the first conductive line on the first surface of the non-conductive substrate includes etching away a portion of the first metal layer, and wherein forming the second conductive line on the second surface of the non-conductive substrate includes etching away a portion of the second metal layer.

32. The method of claim 29, further comprising:
laminating a first metal layer on the first surface of the non-conductive substrate; and
laminating a second metal layer on the second surface of the non-conductive substrate, wherein forming the first passage through the non-conductive substrate includes forming a hole through the first and second metal layers with a laser.

33. The method of claim 29, further comprising:
laminating a first metal layer on the first surface of the non-conductive substrate; and
laminating a second metal layer on the second surface of the non-conductive substrate, wherein forming the first passage through the non-conductive substrate includes drilling a hole through the first and second metal layers.

34. The method of claim 29 wherein at least partially filling the first passage with a first portion of conductive material includes depositing metal at least on the inner walls of the passage.

35. An apparatus for interconnecting electronic components, the apparatus comprising:
non-conductive means having a first surface and a second surface, the first surface facing opposite to the second surface;
first conductive means disposed on the first surface of the non-conductive means for connection to a first electronic component;
second conductive means disposed on the second surface of the non-conductive means for connection to a second electronic component, the second conductive means being laterally offset from the first conductive means;
first passage means formed in the non-conductive means at a first oblique angle relative to the first surface of the non-conductive means;
first plating means for filling at least a portion of the first passage and directly connecting the first conductive means on the first surface to the second conductive means on the second surface;
third conductive means disposed on the first surface of the non-conductive means;
fourth conductive means disposed on the second surface of the non-conductive means, the fourth conductive means being laterally offset from the third conductive means;
second passage means formed in the non-conductive means at a second oblique angle relative to the first surface of the non-conductive means, wherein the second passage means is non-parallel to the first passage means; and
second plating means for filling at least a portion of the second passage and directly connecting the third conductive means on the first surface to the fourth conductive means on the second surface.

36. The apparatus of claim 35 wherein the first conductive means is vertically misaligned relative to the second conductive means.

37. The apparatus of claim 35 wherein the first conductive means include a first conductive line disposed on the first surface of the non-conductive means, and wherein the second conductive means include a second conductive line disposed on the second surface of the non-conductive means.

38. The apparatus of claim 35 wherein the non-conductive means include means for reinforcing an epoxy matrix.

39. The apparatus of claim 35 wherein the non-conductive means include means for bonding a plurality of structural fibers together.

* * * * *

UNITED STATES PATENT AND TRADEMARK OFFICE
CERTIFICATE OF CORRECTION

PATENT NO. : 7,083,425 B2 Page 1 of 1
APPLICATION NO. : 10/927760
DATED : August 1, 2006
INVENTOR(S) : Chong et al.

It is certified that error appears in the above-identified patent and that said Letters Patent is hereby corrected as shown below:

Column 4
Line 19, "one" should be --on a--;

Signed and Sealed this

Second Day of January, 2007

JON W. DUDAS
*Director of the United States Patent and Trademark Office*